United States Patent [19]
Hauge et al.

[11] Patent Number: 4,933,676
[45] Date of Patent: Jun. 12, 1990

[54] PROGRAMMABLE MULTI-INPUT A/D CONVERTER

[75] Inventors: David K. Hauge, Minneapolis; Raymond W. Herbst, Arden Hills, both of Minn.

[73] Assignee: Technology 80, Inc., Golden Valley, Minn.

[21] Appl. No.: 365,095

[22] Filed: Jun. 12, 1989

[51] Int. Cl.$^5$ .............................................. H03M 1/12
[52] U.S. Cl. .................................... 341/141; 341/155; 370/85.1
[58] Field of Search ............... 341/141, 118, 122, 126, 341/155, 161; 370/58, 77, 85.1

[56] References Cited

U.S. PATENT DOCUMENTS 4,216,465  8/1980  Huelsman et al. ................... 341/138
4,365,302  12/1982  Elms ..................................... 364/483
4,644,323  2/1987  Chamran et al. ..................... 341/167

OTHER PUBLICATIONS

Davis et al., "Data Acquisition Moves into the Realm of PCs", Electronic Design, vol. 31, No. 20, 9/29/83, pp. 227–232.

Primary Examiner—William M. Shoop, Jr.
Assistant Examiner—Brian K. Young
Attorney, Agent, or Firm—Paul L. Sjoquist

[57] ABSTRACT

An analog-to-digital converter circuit having an interface and control logic for access and control by a computer processor. The converter has a total of eleven analog voltages coupled to its inputs, three of which are selectable by the computer processor each time the converter is activated. The remaining eight analog voltages may be addressably selected by the computer processor, to enable any single analog voltage to be converted and transferred to the processor during each conversion cycle.

9 Claims, 8 Drawing Sheets

PROGRAMMABLE MULTI-INPUT A/D CONVERTER

BACKGROUND OF THE INVENTION

This invention relates to an apparatus for converting a plurality of analog signals into digital signals for transmission to a computer over a computer databus. More particularly, the invention relates to an analog-to-digital conversion device which may be programmably controlled by a digital computer processor, for sequentially transferring a plurality of analog signals into a single conversion device, for developing a sequence of binary signal representations of the analog signals for transmission over a computer databus to a computer processor Analog-to-digital conversion devices are well known in the art, having been developed as a means for providing signal transformation between devices which generate time-varying analog voltages and devices which operate by virtue of discrete binary signal voltages For example, nearly all forms of rotating shaft devices require time-varying voltages for controlling shaft rotation and position, and such devices are typically electrically or mechanically linked to other shaft-rotating devices for providing analog voltage signal indications which are representative of shaft rotation or position. In order for a computer processor, which operates wholly in the realm of discrete binary voltage signals, to communicate with such analog devices, it has been necessary to develop a wide range of conversion devices at an interface. Utilizing well-known design techniques, computer processors can develop binary drive voltage signals which may then be converted into analog drive voltage signals, for purposes of positioning shaft-rotating machines. Similarly, conversion devices have been developed for receiving analog voltages representative of position or rotation of such shaft-rotating machines, and converting the signals into discrete binary signals for transmission to computer processors.

Any three-axis machine whose position is to be monitored by a computer processor must have three conversion devices, one conversion device for each of the three axes of motion. These axes may be labeled X-, Y-, and Z-axes, or roll, pitch and yaw, or some other convenient frame of reference for the respective degrees of freedom of motion. When the position of three-axis devices are to be monitored, it is convenient to try to capture the voltages representative of all three axes of motion at the same instant of time, so that at a single instant in time the precise position of each axis can be determined. This is preferable to capturing the voltages representative of axis positions in a sequential fashion, because relative motion occurs as between the respective axes even while the information is being processed. Therefore, some degree of error may be introduced by virtue of the time consumed by the measurement mechanism.

In addition to three-axis devices which require essentially three separate analog measurement voltages, there are any number of other analog devices on a typical reasonably complex machine which may require monitoring. Such other devices do not necessarily have an interdependent time relationship, and may therefore be monitored at regular intervals, but in some sort of sequential varying fashion. For example, certain acceleration, velocity, and position devices, as well as devices for measurement of physical parameters such as temperature, pressure, and volume, may need periodic monitoring, but such monitoring is not a critically interdependent requirement. Analog-to-digital conversion devices which interface with these other devices may be monitored at various times and rates, in any sort of random sequence dictated by design and accuracy requirements.

An analog-to-digital conversion device requires, at a minimum, some means of capturing and holding the analog voltage representative of the device position at a moment in time, and a conversion device which can develop a binary signal pattern which is equatable to the captured analog voltage, and a mechanism for transferring the binary signal representation to a computer for further processing. Since the conversion process takes a finite period of time, the analog signal voltage must be fixed during the time required for the transformation process. In the case of multiple-axis device measurements, it is preferable that all of the voltages representative of respective axis positions be captured at the same instant of time, and that all voltages be held until the digital conversion process is completed for all. In the prior art, the typical approach toward achieving this result would be to provide three separate and parallel branches of conversion, wherein each axis analog voltage is separately transformed into a binary representation, more or less simultaneously, and the binary results are then transferred to a computer processor in either parallel or sequential format. This solution requires a full electronics conversion package for each axis, since the conversion process takes place simultaneously for all axes. In addition, if other analog signal voltages are to be converted, it is frequently necessary to provide further analog-to-digital conversion packages for such other signals.

There is a need for an analog-to-digital conversion device which permits simultaneous capture of certain analog signals, but does not require multiple electronic conversion packages corresponding to the number of analog signals being monitored. It is therefore a principal object of the present invention to provide an analog-to-digital conversion system which will economically and accurately transform a plurality of analog signals to binary signal representations It is another object of the present invention to provide an analog-to-digital conversion device for simultaneously capturing multiple-axis analog signals, for subsequent transfer and processing by a digital computer processor.

It is a further object of the present invention to provide an analog-to-digital conversion system which will sequentially process a plurality of analog voltage signals for transfer through a single computer databus.

SUMMARY OF THE INVENTION

The present invention includes a computer channel interface circuit which may be coupled to a standard computer interface channel so as to be programmably selectable by the computer processor, and an analog-to-digital conversion circuit for receiving a plurality of analog signal voltages and converting same into a sequential series of binary representations for transfer over the computer processor data channel bus. Included in the invention is a three-axis analog signal sampling circuit for simultaneously capturing voltages representative of three-axis positions, and a multiplexer for sequentially processing these analog voltages through a single analog-to-digital conversion circuit.

BRIEF DESCRIPTION OF THE DRAWINGS

The foregoing and other objects of the invention will become apparent from the following specification and claims, and with reference to the appended drawings, in which:

DESCRIPTION OF THE PREFERRED EMBODIMENT

Figure 1:
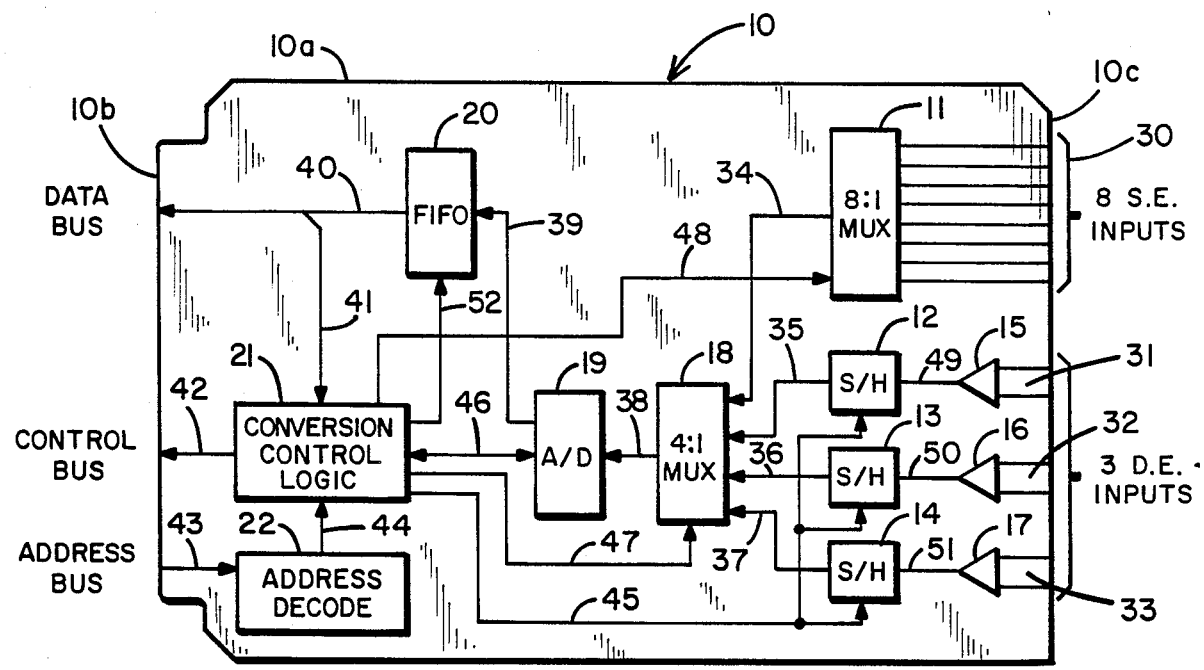
FIG. 1 shows a functional block diagram of the invention mounted on a single printed circuit board.

Referring first to FIG. 1, the programmable multi-input A/D converter 10 is shown in functional block diagram form, and also according to a possible layout on a printed circuit board 10a. It may be presumed that the left edge 10b of the circuit board 10a, which contains circuit 10 includes a plurality of conductor pads which may be insertable into a suitable receptacle, so as to provide electrical connections to a computer processor databus, control bus and address bus. Such connections are of the type which is well known and understood in the art of computer processors, and well within the skill of those familiar with this art. The right edge 10c of the printed circuit board which contains converter 10 may contain a plurality of conductive connection pads to accommodate a further electrical receptacle, which may be connected to the necessary analog-voltage generating devices. For example, a connector and cable 30 may be coupled to the converter circuit board, for providing up to eight single-ended analog voltage signals. A single-ended analog voltage signal is one referenced to a common ground, wherein the signal voltage may be transferred over a single wire connector. Further, one or more connectors may be coupled to provide three double-ended voltage signals 31, 32 and 33, as may be required for monitoring a three-axis device. The double-ended voltage signals require two lines, because such devices do not necessarily utilize a common ground connection.

The eight analog voltage signals provided via lines 30 are coupled into a single 8:1 multiplexer, which may be controllably activated via signals over lines 48 to transfer any one of the eight analog voltage signals to an output line 34. The signals input on each of the lines 31, 32, 33 are individually passed through an interface buffer circuit 15, 16, 17 to a sample-and-hold circuit 12, 13 and 14. The respective buffer and sample-and-hold circuits are identical for each of these three inputs, and therefore will be described further with reference to only one of them. The outputs from the sample-and-hold circuits 12, 13 and 14 are separately fed to a 4:1 multiplexer circuit 18. Multiplexer circuit 18 is activated by control signals over line 47, to provide the transfer of one of its four inputs 34, 35, 36, 37, via line 38 to analog-to-digital converter 19.

Analog-to-digital converter 19 transfers a binary signal representation of the analog signal received at its input, to first in-first out (FIFO) register 20. Register 20 comprises a plurality of sequential shift registers for receiving parallel binary inputs over lines 39, shifting the received values through banks of registers internally, and transmitting the last register contents to the computer databus via lines 40.

Control over the entire A/D converter 10 is derived from a computer processor (not shown) which may be of a standard construction of the many types found in the art. The computer processor typically utilizes a computer databus for transferring binary signals external to the processor, an address bus for selectively activating various peripheral devices, and a control bus for generating activation and timing signals required for the data transfer The computer processor control bus is connected to conversion control logic 21 via lines 42. The computer processor address bus is connected to address decode logic 22 via lines 43. Address decode logic 22 and conversion control logic 21 act together to provide the necessary timing and control signals for the analog-to-digital selection and conversion steps which occur within circuit 10. Conversion control logic 21 is also connected to the computer databus via lines 41, and is internally connected for activating suitable control signals to the FIFO registers 20 via lines 52, to the 8:1 multiplexer 11 via lines 48, to the analog-to-digital conversion circuit 19 via lines 46, to the 4:1 multiplexer circuit 18 via lines 47, and to the sample-and-hold circuits 12, 13 and 14 via lines 45. Each of these separately identified lines may in fact be one or more individual control signal lines, as will be hereinafter described.

Figure 2:
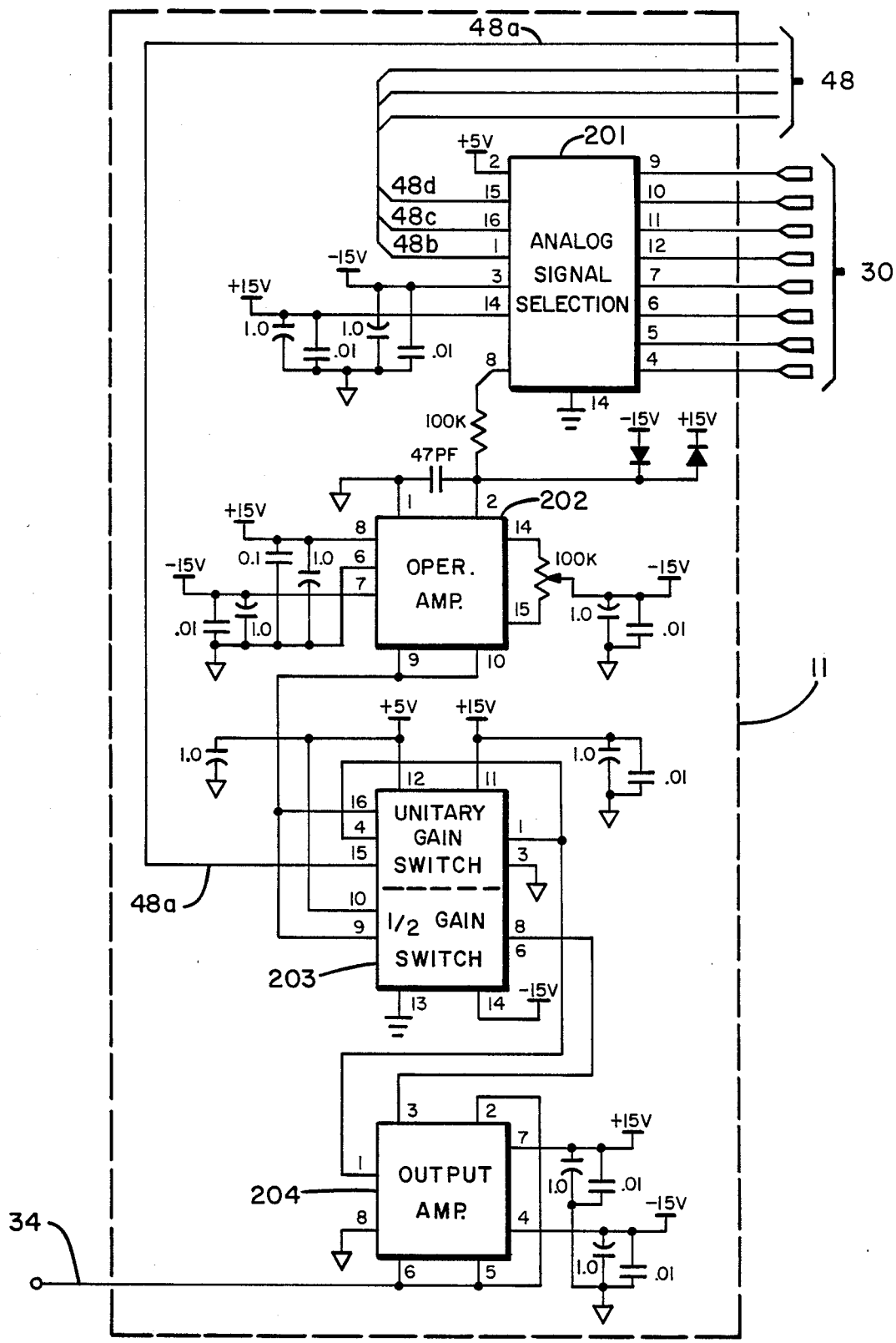
FIG. 2 shows an analog voltage multiplexer for transferring one of eight analog voltages to an output.

Referring next to FIG. 2 there is shown a circuit schematic for 8:1 multiplexer 11. Multiplexer 11 receives eight analog voltage signals via lines 30, and four control signals via lines 48. The analog voltage signals are received by an analog signal selection circuit 201, which is a semiconductor circuit of the type which may be commercially obtained, as for example, a Harris semiconductor circuit type HI508A. This circuit also receives three control signal inputs via lines 48b, 48c, 48d, which represent binary selection signals capable of selecting any one of the eight input analog signal lines. A fourth control signal is received on line 48a, to select a gain setting for multiplexer 11. The gain may be selected to be either unitary or ½, depending upon the presence or absence of the signal on line 48a.

The numbers which appear immediately adjacent analog signal selection circuit 201 identify corresponding pin connection numbers on the semiconductor circuit chip. This convention is followed throughout, wherein a semiconductor circuit may be identified by a type number and manufacturer, and connections to the circuit are further identified by pin number indications to show external connections to the semiconductor circuit. Individual circuit elements are shown by their conventional signals, and circuit values are indicated on the drawings immediately adjacent the circuit symbols. In the case of capacitors, all capacitance values are presumed to be in microfarads (uf) unless otherwise designated as picofarads (pf). Power supply voltage values are also indicated on the respective drawings, adjacent appropriate power supply connection symbols. Resistance values are indicated in their conventional form, i.e., 100 K means 100 kilohms. Conventional symbols are used to indicate connections to ground or common connection points.

The signals which appear on lines 48a–48d are initiated in the computer processor as selection signals to select any one of the eight single-ended analog voltage input signals on lines 30. The computer process transmits these selection signals via lines 41 to conversion control logic circuit 21, and conversion control logic circuit 21 passes the selection signals to multiplexer 11 via lines 48. During any single conversion cycle, which consists of a set of four analog-to-digital conversions, only one of the eight single-ended analog input signals may be converted and transferred to the computer processor. The selection of any particular single-ended analog signal is accomplished by the binary signals on lines 48b, 48c, and 48d; this signal combination results in analog signal selection circuit 201 sending the selected analog signal to operational amplifier 202. Operational amplifier 202 is a high impedance input-low impedance output amplifier which may be of commercial manufacture, as for example type INA110, manufactured by Burr-Brown. The output of operational amplifier 202 is connected into both halves of a gain switch 203. Gain switch 203 operates in conjunction with output amplifier 204, to select either a unitary gain or a ½ gain for the operation of output amplifier 204. The selection of gain value is controlled by a binary signal on line 48a, which originates in the computer processor and is transferred to multiplexer 11 via lines 48. Switch circuit 203 may be commercially obtained, as for example type HI5051, manufactured by Harris: output amplifier 204 is of similar commercial manufacture, as for example type INA105, manufactured by Burr-Brown.

The single-ended analog voltage signal which is selected by the circuits within multiplexer 11 is presented at output lines 34, where it is transferred to a 4:1 multiplexer 18.

Figure 3:
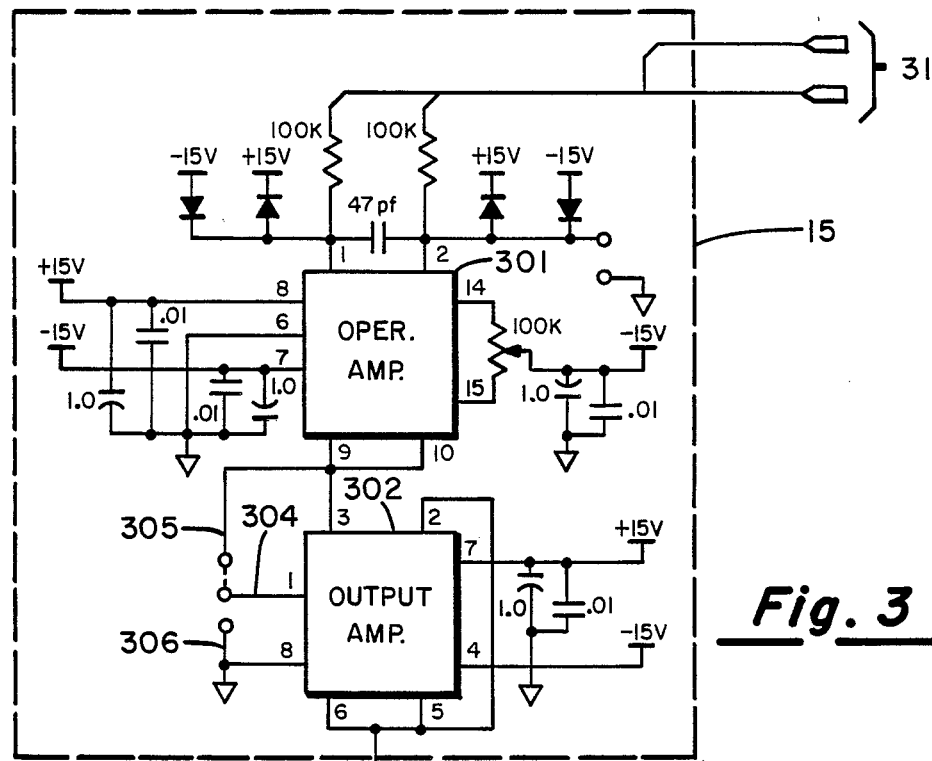
FIG. 3/shows a sample-and-hold circuit for capturing an analog voltage signal for subsequent transfer.

Circuit 10 also has input lines 31, 32 and 33, which are each capable of receiving a double-ended analog voltage signal input. Since the circuits which receive these double-ended analog signals are identical, the following description will describe the circuits with respect to only one of these signal inputs. FIG. 3 shows an interface buffer circuit 15 and sample and hold circuit 12, which received the double-ended analog voltage signal on lines 31. The signal is connected into an operational amplifier 301, which may be commercially obtained as type INA110, manufactured by Burr-Brown. Operational amplifier 301 converts the signal into a low impedance output signal and feeds it to output amplifier 302, which may be type INA105, obtainable from Burr-Brown. Output amplifier 302 is connected to line 49, which feeds into holding circuit 303. Holding circuit 303 is a commercially available circuit, as for example Harris type H98716. Holding circuit 303 receives an input gating signal on line 45, from conversion control logic circuit 21, which causes the analog signal voltage being held by holding circuit 303 to be transferred to multiplexer 18 via line 35. The remaining sample and hold and input buffer circuits 13, 16 and 14, 17 are similarly connected to multiplexer 18 via lines 36 and 37 respectively.

Output amplifier 302 has a selectable gain setting which may be set by one of two wiring connections. Line 304 is a gain setting input into output amplifier 302, and it may be jumpered to line 305 (as shown) for a unitary gain setting, or it may be jumpered to line 306, for a gain setting of ½. This selection of gain is typically accomplished by a wiring jumper which is inserted into the circuit prior to its use.

Figure 4:
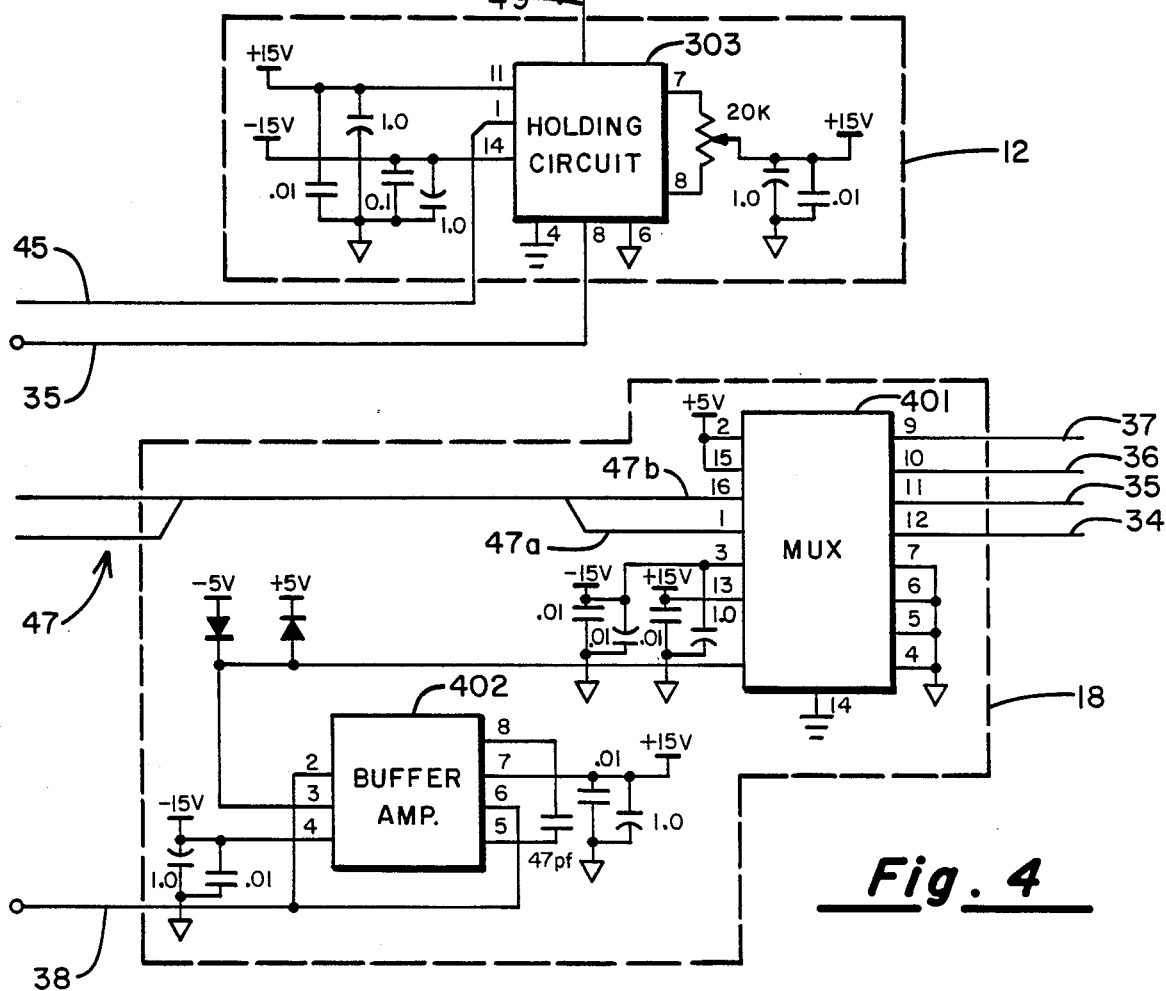
FIG. 4 shows an analog voltage multiplexer for transferring one of four analog voltage signals to an output.

Multiplexer 18, shown in FIG. 4, receives four analog input signals over lines 34–37, which signals are initially conveyed to a multiplexer circuit 401, of a type commercially obtainable from Harris, type HI508A. The output from multiplexer circuit 401 is coupled into buffer amplifier 402, and is then sent to analog-to-digital converter circuit 19 via line 38. The selection of the appropriate analog signals which are received by multiplexer circuit 401 is obtained by signals on lines 47, specifically lines 47a and 47b. These signals are binary count values, which are generated by conversion control logic circuit 21 The signals require multiplexer circuit 401 to sequence its four analog input signals to output line 38, i.e., signals on lines 34, 35, 36, and 37.

Figure 5:
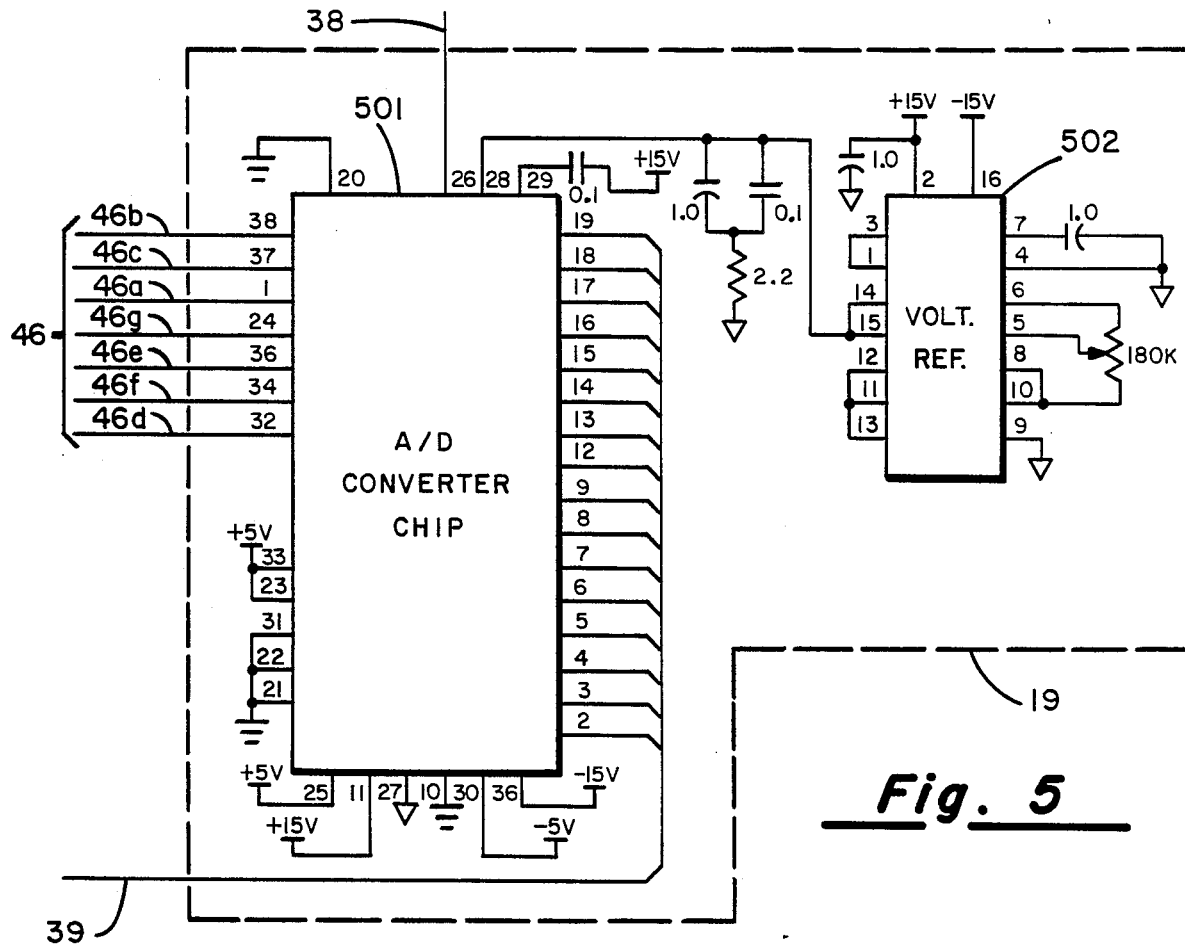
FIG. 5 shows an analog-to-digital conversion circuit.

FIG. 5 shows a diagram of analog-to-digital multiplexer circuit 19. Circuit 19 receives a single analog input signal via line 38, and transmits a parallel binary output representation of the input signal to FIFO register 20 via lines 39, in the form of 16 parallel bits. The A/D converter circuit 19 is activated by signals over lines 46 from conversion control logic circuit 21; these signals are illustrated as lines 46a–46g. The heart of the A/D converter logic circuit 19 is an A/D converter chip 501, which is of standard commercial manufacture, as for example type CS5016, manufactured by Crystal Semiconductor Corp. A/D converter chip 501 also utilizes a voltage reference circuit 502, which may be type AD588, manufactured by Analog Devices. Voltage reference circuit 502 serves to apply a reference input voltage into circuit 501 in order to enable circuit 501 to make the necessary analog-to-digital conversion. The input signals which control the operation of A/D converter chip 501 may be described as follows:

Line 46a—receives a signal which commands the A/D converter chip 501 to begin a conversion of a single analog signal into an equivalent binary form; this signal is generated four times during each conversion cycle.

Line 46b—a signal is generated on this line by the A/D converter chip 501 to signal that it has completed the current conversion.

Line 46c—a signal is generated on this line by the A/D converter chip 501 to signal that it is ready to start a new conversion; it is repeated four times during each conversion cycle.

Line 46d—this signal is received from the conversion control logic circuit 21 to reset the A/D converter chip 501 at the start of an operation.

Line 46e, 46f—these signals are generated by the conversion control logic circuit 21 to cause the A/D converter chip 501 to begin certain self-calibration cycles.

Line 46g—this signal is generated by conversion control logic circuit 21 to select whether unipolar or bipolar polarity is to be utilized during the next conversion.

Figure 6:
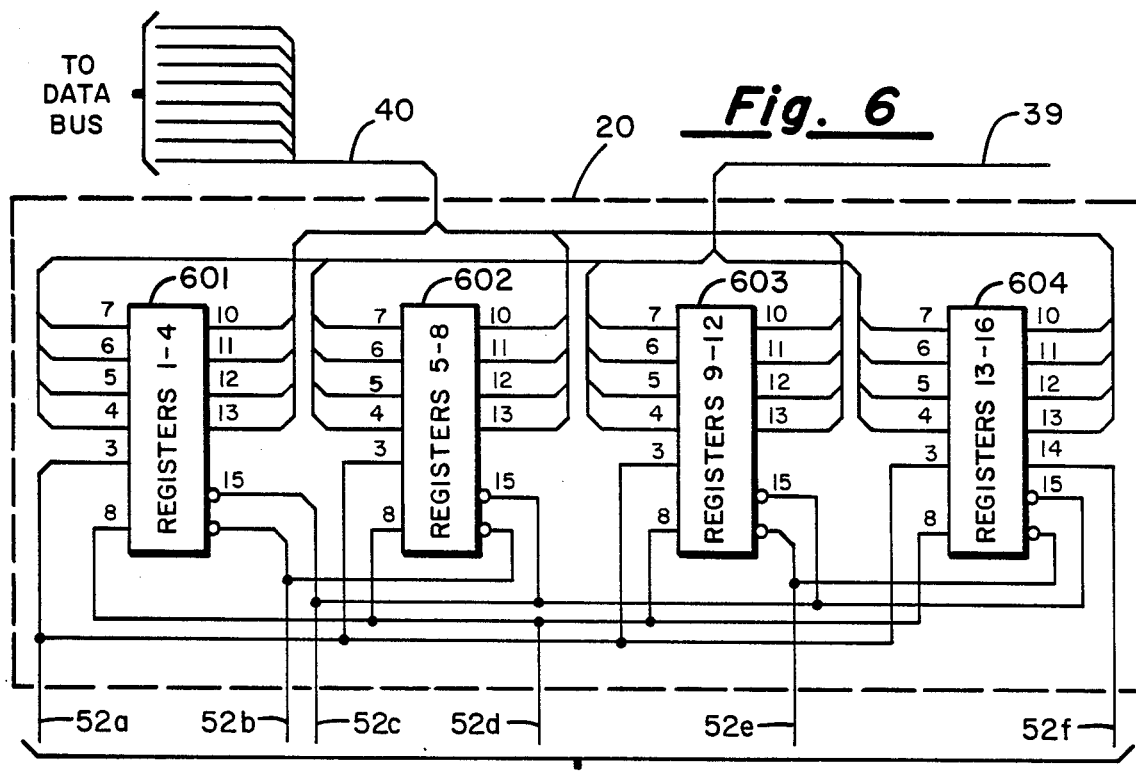
FIG. 6 shows a first in-first out register used with the present invention.

FIG. 6 shows the FIFO registers 20; which are formed of four semiconductor chips of a type which may be commercially obtained, as for example type 74HCT40105, obtainable from Signetics Corporation. Each of the semiconductor chips 601, 602, 603 and 604 contains sixteen 4-bit registers, arranged in the form of an input register (pins 4–7), fourteen internally-connected registers, and an output register (pins 10–13). The internal logic of each of the semiconductor registers sequentially transfers any data received by the input register to the output register, or the highest ranking internal register which has not previously been filled with data. In the present invention, four ranks of the registers internal to each of the semiconductor chips are required to receive and store data from the four conversions which occur during a single conversion cycle. The input signals which control the operation of FIFO register 20 may be described as follows:

Line 52a—this signal is generated by the conversion control logic circuit 21 to strobe the data on lines 39 into the first input register rank; the signal is generated at the end of each A/D conversion.

Line 52b—this signal is generated by the conversion control logic circuit 21 to place the lower eight bits of the 16-bit conversion data onto lines 40 for transmission to the computer databus.

Line 52e—this signal is generated by the conversion control logic circuit 21 to place the upper eight bits of the 16-bit conversion data onto lines 40 for transmission to the computer databus.

Line 52c—this signal is generated by the conversion control logic circuit 21 to strobe data out of the FIFO so that the next conversion data may be read by the computer processor via the databus lines 40.

Line 52d—this signal is generated by the conversion control logic circuit 21 to reset the FIFO so that all previously-received data is erased; this signal is generated at the beginning of each conversion cycle.

Line 52f—this signal is generated by the FIFO register 604 to indicate that there is valid data contained within FIFO 20 to be read by the computer processor.

FIFO register 20 operates to receive a 16-bit conversion word via lines 39, wherein the lower eight bits are placed into semiconductor circuit 601 and 602, and the higher eight bits are placed into semiconductor circuit 603 and 604. After four conversions the 16-bit conversion data is fully loaded into FIFO register 20. The control signals over lines 52, as described above, control the loading and unloading process relative to FIFO registers 20. Lines 40 are coupled to the computer databus, transferring eight bits of data to the databus during any single transfer operation. The eight bits of data may be derived from the output registers in semiconductor circuits 601, 602 or from semiconductor circuits 603, 604 depending upon control lines 52. The respective semiconductor circuits 601, 604 are labeled registers 1–4, registers 5–8, registers 9–12, and registers 13–16, to indicate respective portions of the 16-bit conversion data that each semiconductor circuit retains during the conversion process.

Figure 7:
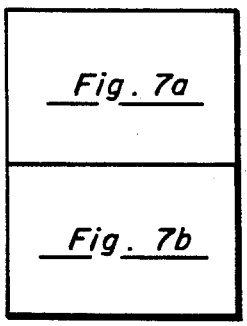
FIG. 7 shows the layout of FIGS. 7a and 7b, which illustrate control and address logic used with the present invention.
Figure 7A:
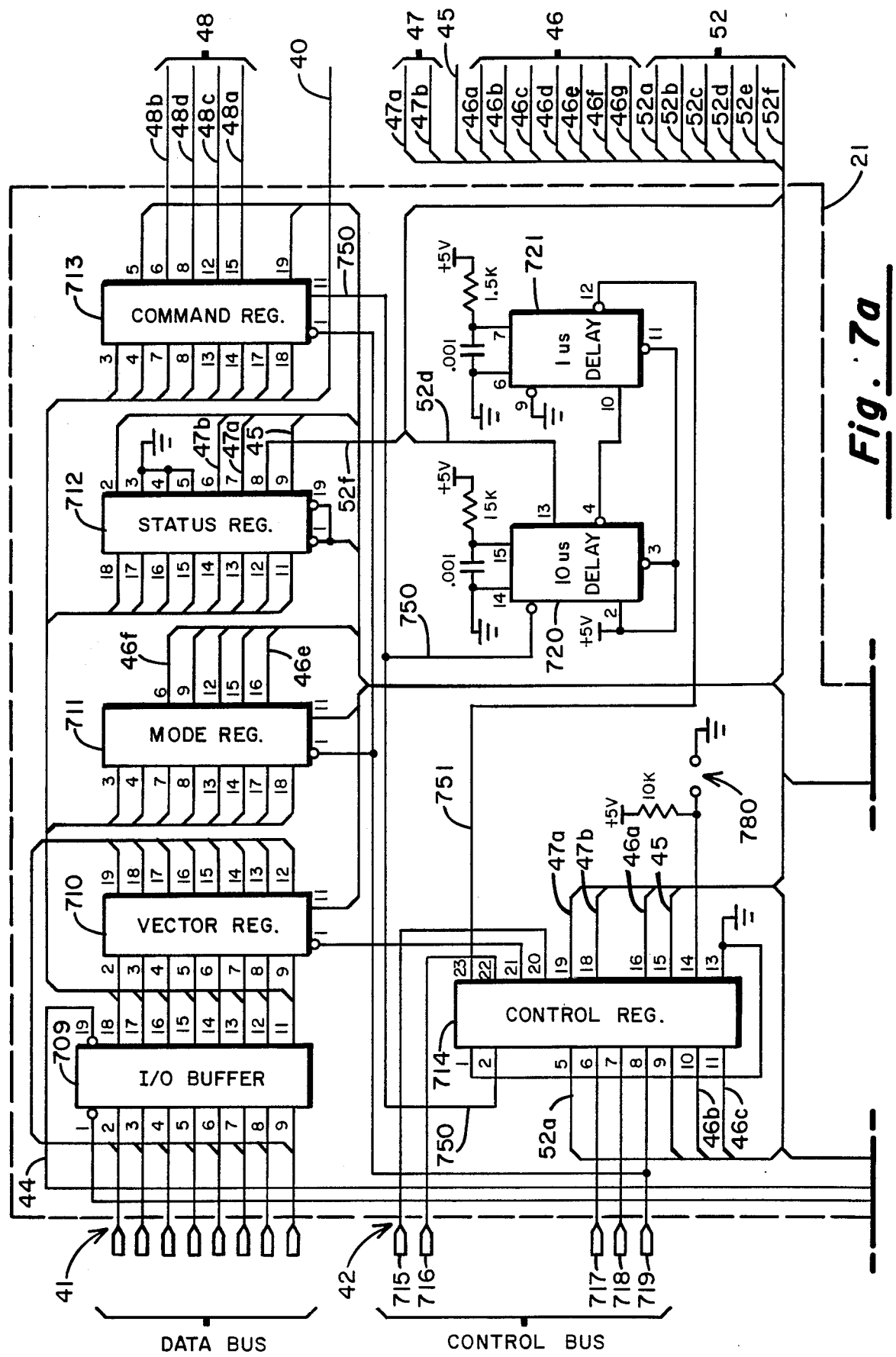
Figure 7B:
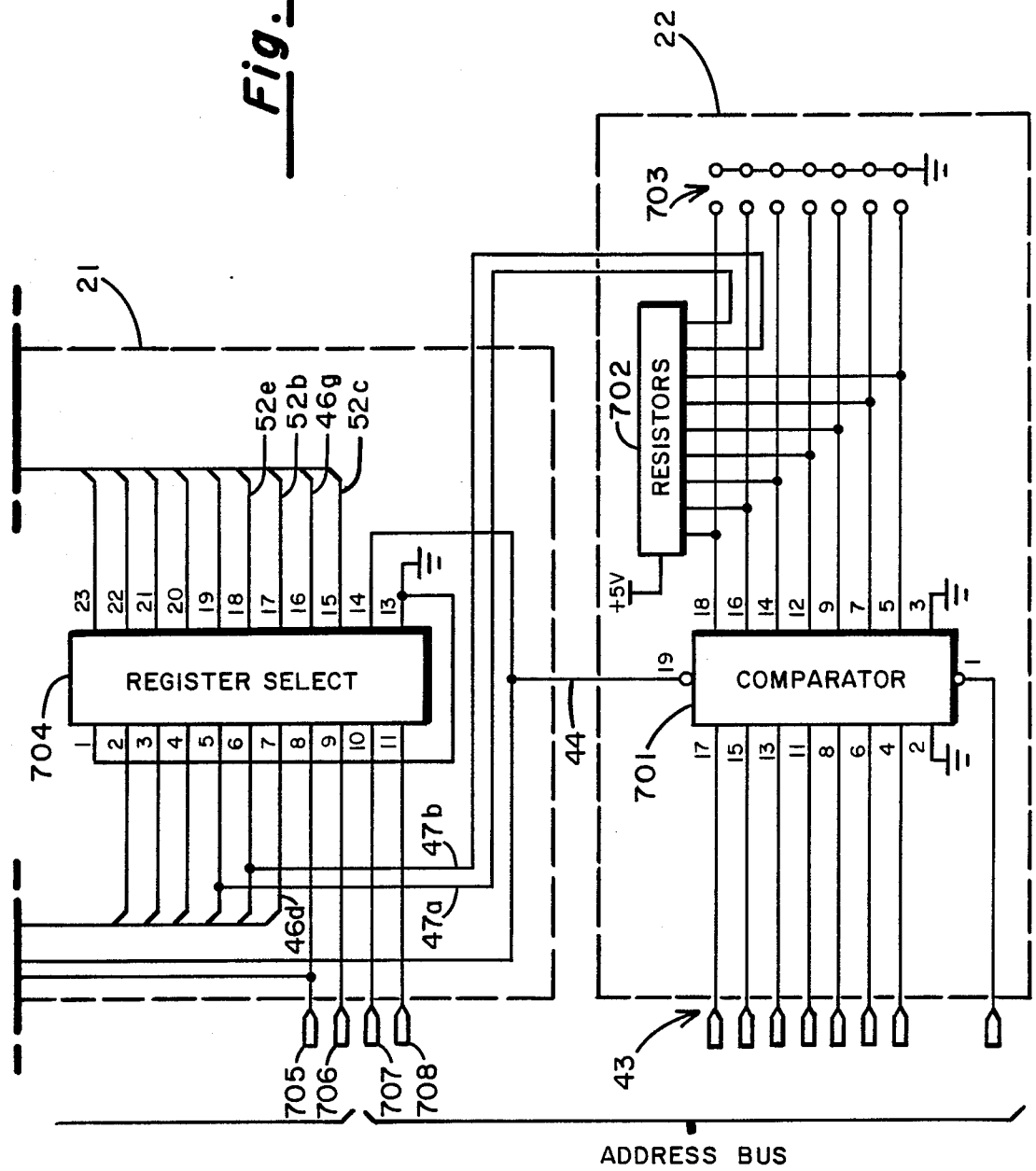

FIG. 7 shows the layouts of FIGS. 7a and 7b, which illustrate the schematic diagram of conversion control logic circuit 21 and address decode circuit 22. Conversion control logic circuit 21 is connected via suitable terminal connections along circuit board edge 10b to a computer processor databus 41, and a computer processor control bus 42. The signals which are sent and received over control bus 42 and databus 41 are formatted according to conventional computer processor operational requirements as are the signals received by address decode logic circuit 22 from the computer process address bus 43. The A/D converter 10 is addressable by a computer processor in the same manner as any other standard input/output device might be coupled to a computer processor. For example, the computer processor generates an address selection value to activate A/D converter 10 and its various internal operations, the computer processor control bus permits the two-way transfer of control information, and the computer processor databus permits the two-way transfer of data information. The computer processor may transfer data and commands to the A/D converter 10 via the databus, and it receives the A/D conversion values via the databus.

Referring first to FIG. 7b, address decode logic circuit 22 is shown coupled to address bus 43. A comparator circuit 701 has one set of inputs connected to address bus 43, and a second set of inputs connected to a plurality of jumper connections 703. A resistor network 702 consists of a plurality of 10 K ohm resistors connected to a +5 volt power supply at one end, with each of the resistors then connected to one of the input lines to comparator 701, to serve as voltage pullup resistors. One or more of the jumper connections 703 are completed to ground, thereby grounding one or more of the comparator 701 inputs; this serves to provide a hard-wired address identity for A/D converter 10. When the address data which appears on address bus 43 contains the same pattern of binary information as is represented by the grounded connections of jumper 703, line 44 becomes activated to indicate that the A/D converter 10 has been selected by the computer processor. Comparator circuit 701 may be commercially obtained from various manufacturers, as for example, Texas Instruments Company, under type designation 74HCT688.

The signal on line 44 is transmitted to register select circuit 704, to enable register select circuit 704 to receive certain information bits from control bus 42, via lines 705–706, and two address bus lines 707 and 708. The signal on line 705 indicates whether or not a "read" operation is to occur; i.e., whether information is to be transferred from A/D converter 10 to the computer processor. The signal on line 706 indicates whether or not a "write" operation is to occur; i.e., whether the computer processor is transferring information to A/D converter 10. Lines 707 and 708 contain address bus signals which indicate which register within A/D converter 10 is required to be accessed in the case of a "write" operation, and which FIFO register is to be transferred in the case of a "read" operation.

Register select circuit 704 is a programmable logic array circuit which is commercially available. One form of circuit which is useful with the invention is manufactured by Altera Corporation under type designation EP600. The circuit is programmable according to techniques which are well known in the art, and in the case of the present invention the circuit is programmable to provide the register selection and gating signals which are described herein Control circuit 714 receives inputs from various other registers, as identified below:

Pin 22—polarity designation for single-ended input analog signals, from command register 713, pin 5.
Pin 2—polarity designation for double-ended analog signal on lines 33, from mode register, pin 15.
Pin 3—polarity designation for double-ended analog signal on lines 32, from mode register, pin 9.
Pin 4—polarity designation for double-ended analog signal on lines 31, from mode register, pin 12.
Pin 5, 6—binary count value to identify the analog signal currently being converted, from status register, pins 6 and 7 (lines 47a, 47b).

Pin 8—"read" strobe from control bus (line 705).
Pin 9—"write" strobe from control bus (line 706).
Pin 10, 11—least significant bits from address bus 43 (lines 707 and 708).
Pin 14—circuit selection signal from comparator 701 (line 44).

Register select circuit 704 generates certain output signals which may be identified as follows:

Pin 22—"write" signal to mode register 711, pin 11.
Pin 21—"write" signal to command register 713, pin 11.
Pin 20—"read" signal to status register 712, pins 1 and 19.
Pin 19—"write" signal to vector register 710, pin 11.
Pin 18—"read" signal to FIFO register 20, line 52a.
Pin 17—"read" signal to FIFO register 20, line 52b.
Pin 16—polarity identifier to A/D converter circuit 19, pin 24 (line 46g).
Pin 15—"strobe" signal to FIFO register 20, line 52c.
Pin 7—"reset" signal to A/D converter circuit 19, line 46d.

The logic equations for preparing register select circuit 704 are tabulated in Table 1 below. These equations are expressed in terms of the circuit terminal numbers or pin numbers, and the internal logic of the circuit is prepared so as to provide the logical relationships described in the Table. The symbol "/" indicates an inverted logic value, the symbol "&" indicates a logical "AND" connection, and the symbol "#" indicates a logical "OR" connection.

TABLE 1

| | |
|---|---|
| Pin 7 | = /Pin 14 & /Pin 9 & Pin 11 & Pin 10 |
| /Pin 19 | = /Pin 14 & /Pin 9 & Pin 11 & /Pin 10 |
| /Pin 21 | = /Pin 14 & /Pin 9 & /Pin 11 & Pin 10 |
| /Pin 22 | = /Pin 14 & /Pin 9 & /Pin 11 & /Pin 10 |
| /Pin 20 | = /Pin 14 & /Pin 8 & Pin 11 & /Pin 10 |
| /Pin 17 | = /Pin 14 & /Pin 8 & /Pin 11 & Pin 10 |
| /Pin 18 | = /Pin 14 & /Pin 8 & /Pin 11 & /Pin 10 |
| Pin 15 | = /Pin 17 |
| Pin 16 | = Pin 23 & /Pin 6 & /Pin 5 |
| | # Pin 4 & /Pin 6 & Pin 5 |
| | # Pin 3 & Pin 6 & /Pin 5 |
| | # Pin 2 & Pin 6 & Pin 5 |

The selection signal on line 44 is also gated to I/0 buffer register 709 (FIG. 7a) to condition buffer register 709 to either receive data from databus 41, or to transmit data to databus 41. I/O buffer register 709 serves as an interface register between databus 41 and the other registers in conversion control logic circuit 21. A vector register 710 may receive data from databus 41 to retain an interrupt address, associated with an address in the computer processor, for subsequent interrupts relating to the processing of the A/D conversion values. Vector register 710 can be gated to transmit its contents back to databus 41 upon command from the computer processor.

A mode register 711 stores information relating to the internal operating mode of A/D converter 10, and this register may be loaded by the computer processor, wherein the contents of the register are received from to databus 41 via I/O buffer register 709.

A status register 712 stores information relating to the internal operating status of A/D converter 10, and this register may be interrogated by the computer processor to transmit its contents to databus 41 via I/O buffer 709.

A command register 713 stores various operational commands which originate within the computer processor, which commands are used to control specific operations within A/D converter 10. Command register 713 receives its information from databus 41 via I/O buffer 709.

All of the registers 709–713 are readily obtainable from commercial sources, as indicated by the following representative list:

Register 709—Texas Instruments type 74HCT245
Register 710—Texas Instruments type 74HCT574
Register 711—Texas Instruments type 74HCT273
Register 712—Texas Instruments type 74HCT541
Register 713—Texas Instruments type 74HCT273

Control circuit 714 generates the internal control signals which are necessary to operate A/D converter circuit 10, and interacts with the computer processor through signals on lines 715–719 of control bus 42. The signals which are transmitted and/or received over these lines are identified as follows:

Line 715—a signal to the computer processor to indicate that the databus is transferring conversion information to the computer processor.
Line 716—a signal to the computer processor requesting an interrupt for a databus transfer
Line 717—a signal received from the computer processor acknowledging an interrupt.
Line 718—a signal from the computer processor indicating data is being transmitted from the computer processor via the databus to the A/D converter 10.
Line 719—a signal from the computer processor indicating the internal registers of A/D converter circuit 10 should be reset.

Control circuit 714 receives a number input signals from the computer processor and other circuits within A/D converter 10. These input signals are as follows:

Pin 2—"write" select signal from command register 713, pin 11, line 750.
Pin 6—"interrupt acknowledge" signal from the computer processor control bus, line 717.
Pin 7—"priority chain" signal from the computer processor control bus, line 718.
Pin 8—"reset" signal from the computer processor control bus, line 719.
Pin 9—"interrupt enable" signal from command register 713, pin 19.
Pin 10—a signal indicating the end of an A/D conversion, line 46b.
Pin 11—a signal indicating that A/D converter 19 is ready to begin the next conversion, line 46c.
Pin 14—a prewired signal which is created by connections at jumper 780, to indicate the type of computer processor which is connected to the system (8088 or 8085 CPU type).
Pin 23—a "start" signal to initiate the A/D conversion process, line 751.

Control circuit 714 also has a number of output pin connections, which may be identified as follows:

Pin 22—an interrupt request signal to the processor control bus, line 716.
Pin 21—a gating signal to vector register 710 to gate the contents of the register to the databus.
Pin 20—a signal to the computer processor control bus to indicate a priority chain output, line 715. pin 18, 19—a binary count value to indicate the identity of the current analog channel being converted, lines 47a, 47b.
Pin 16—a signal to A/D converter 19 to initiate the conversion, line 46a.

Pin 15—a signal to the sample-and-hold circuits 12, 13 and 14 to store the analog voltage values, line 45.

Pin 5—a gating signal to the FIFO register 20, line 52a.

Control circuit 714 is a programmable logic array of the same type as register select circuit 704. It may be programmed according to techniques well known in the art, and Table 2 shows the logic equations which result from the programming of control circuit 714. The symbols in Table 2 have the same meaning as those in Table 1, with the additional convention that symbols such as "CK", "AR", etc., are defined in the technical specifications published by the manufacturer of the semiconductor

TABLE 2

| | |
|---|---|
| /Pin 20 | = /Pin 7 # Pin 3 |
| Pin 3.CK | = Pin 15 & Pin 21 |
| Pin 3.AR | = /Pin 2 |
| Pin 3.T | = Pin 9 |
| Pin 22 | = 0 |
| Pin 22.OE | = Pin 9 & Pin 3 |
| Pin 4.CK | = Pin 6 |
| Pin 4.T | = 1 |
| Pin 4.AR | = /Pin 2 |
| /Pin 21 | = Pin 7 & /Pin 6 & Pin 3 |
| | & (Pin 14 & Pin 4 # /Pin 14) |
| Pin 19.CK | = Pin 11 |
| Pin 18.CK | = Pin 11 |
| Pin 19.T | = 1 |
| Pin 18.T | = /Pin 19 |
| Pin 19.AR | = Pin 15 |
| Pin 18.AR | = Pin 15 |
| /Pin 16 | = /Pin 23 |
| | # /Pin 11 & /(/Pin 19 & /Pin 18) |
| Pin 15.CK | = /Pin 11 |
| Pin 15.D | = /Pin 19 & /Pin 18 |
| Pin 15.AR | = /Pin 8 |
| Pin 5.CK | = /Pin 11 |
| Pin 5.D | = 1 |
| Pin 5.AR | = Pin 5.IO |

The initiation of an A/D conversion cycle begins with the transfer of information from the computer processor to the command register 713. In addition to selecting one of the eight single-ended analog inputs present on lines 30, and selecting the gain for such input signals, the command register generates a signal on line 750 to activate control circuit 714. The signal on line 750 also is transferred to a 10 microsecond delay circuit 720. After a 10 microsecond delay, circuit 720 transmits a signal to 1 microsecond delay circuit 721, which generates a "start" signal on line 751. The "start" signal initiates the conversion cycle which has been hereinbefore described, and which will be further described hereinafter. Delay circuit 720 and 721 are commercially available components, as for example, Texas Instruments type 74HCT221.

Figure 8:
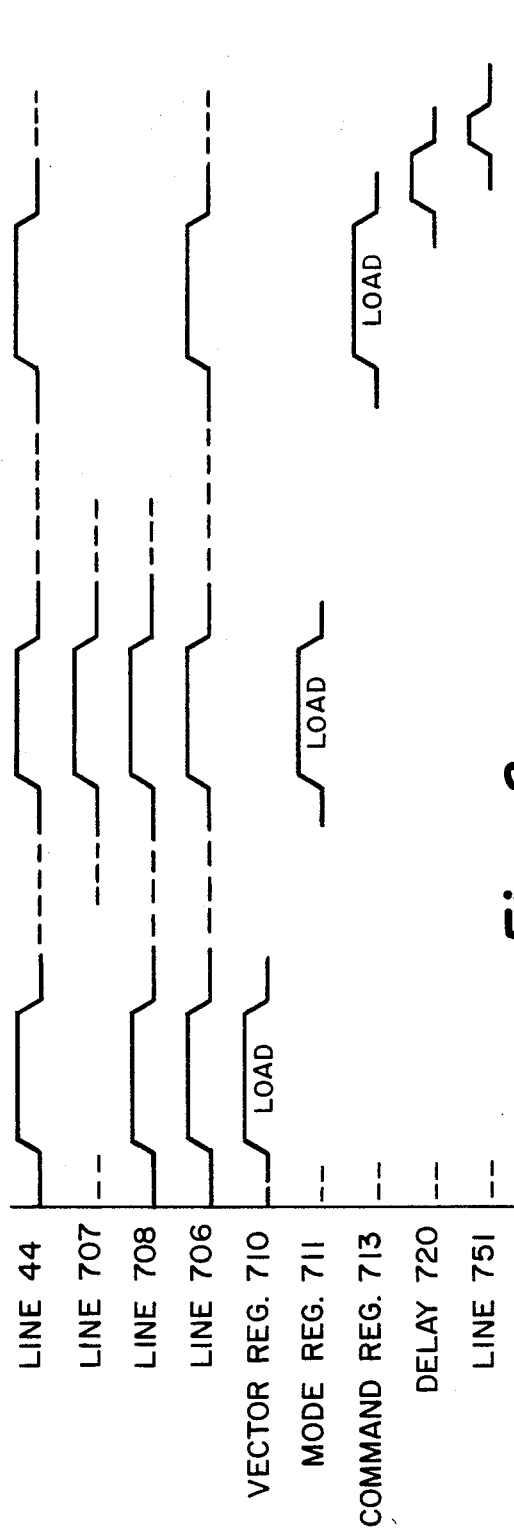
FIG. 8 shows the timing relationship of signal and data from the computer processor for initialing a conversion cycle.

FIG. 8 shows the timing relationship of various signals from the computer processor to initiate a conversion cycle within A/D converter 10. As indicated hereinbefore, a signal on line 44 indicates that A/D converter 10 has been selected by the computer processor. The signals on lines 707 and 708 are address bus signals, specifically the two least significant bits of the address bus. These signals indicate which register in A/D converter 10 is to be accessed for receiving data from the computer processor. In the first instance, vector register 710 is loaded with data because line 708 is up while line 707 is down; in the second instance mode register 711 is selected to receive data because both lines 708 and 707 are up; in the third instance the command register 713 is selected to receive data because lines 707 and 708 are both down. Line 706, in each instance, is a gating signal to permit signals from the databus to be gated into registers.

After the command register 713 has been loaded a signal is sent via line 750 to the 10 microsecond delay circuit 720. After the 10 microsecond delay circuit 720 sends a signal to delay circuit 721, and after a 1 microsecond delay circuit 721 sends a signal via line 751 to control circuit 714; the signal on line 751 is considered the "start" signal to activate A/D converter 10.

Figure 9:
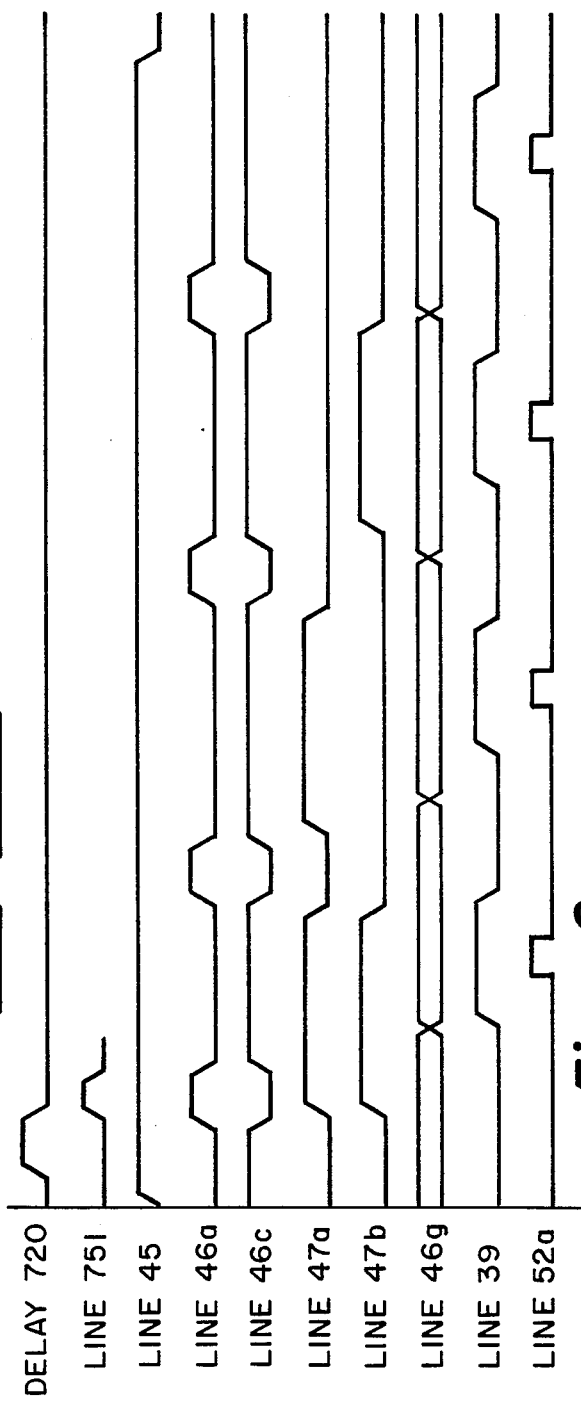
FIG. 9 shows a timing relationship of signals generated during a conversion cycle.

FIG. 9 shows further timing signals, illustrating the internal timing relationships during a conversion cycle. The signal on line 45 causes sample-and-hold circuits 12, 13 and 14 to simultaneously capture the analog voltages present at analog input lines 31, 32 and 33. The signal on line 46a commands the A/D converter chip 501 to begin a conversion of the analog signal present at its input into an equivalent binary form; this signal is generated four times during each conversion cycle, once for each of the four analog voltage values which may be gated into A/D converter circuit 19. The signal on line 46 is generated by the A/D converter chip 501 to signal that it has completed the conversion and is ready to start a new conversion. The signal combinations on lines 47a and 47b select the four possible analog voltage inputs into multiplexer 18, for conversion by A/D converter circuit 19. The signal on line 46g is a polarity indication signal, selected by the computer processor, and may be of either magnitude depending upon the needs of the computer processor. The signals on line 39 represent the gating of the representative binary voltage values from the A/D converter circuit 19 into the FIFO register 20. The signal on line 52a represents a gating signal to gate the data on line 39 actually into the FIFO register.

Figure 10:
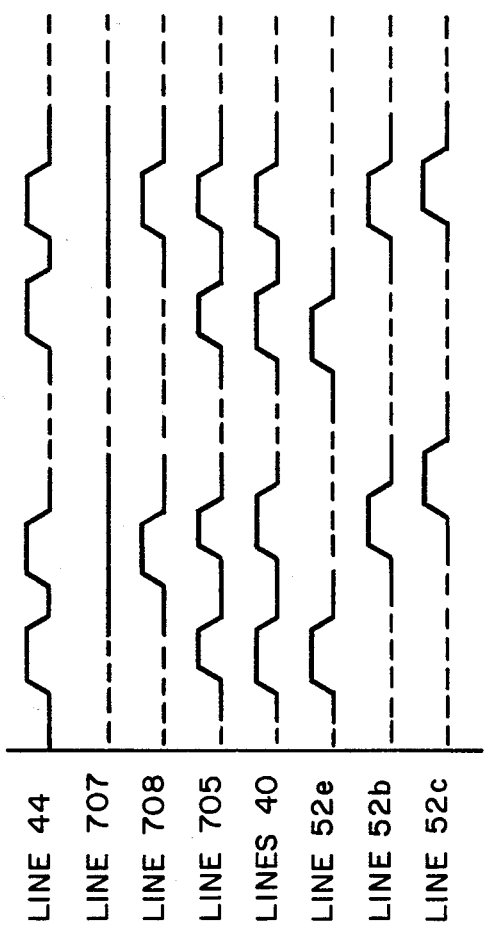
FIG. 10 shows a timing relationship of signals required for transferring data back to the computer processor.

FIG. 10 shows the timing relationship of the transfer of data from the A/D converter 10 into the databus lines. Line 44 indicates that the A/D converter has been selected, and in the case of a selection of the A/D converter 10 for transferring data from the FIFO register 20 into the databus line 40, two sequential selection signals are required. In this case, lines 707 and 708 represent address values to determine whether the upper 8-bit portion of the FIFO register is to be transferred or the lower 8-bit portion is to be transferred. Line 705 is a signal which indicates that a "read" operation is occurring, requiring the transfer of data from the FIFO registers or elsewhere within A/D converter 10 into the databus lines. The signals on line 40 indicate the actual transfer of information into the databus. The signal on line 52e gates the upper 8-bits of the FIFO output register into the databus, and the signal on line 52b gates the lower 8-bits of the output FIFO register into the databus. The signal on line 52c strobes data out of the FIFO output register so that the next conversion can be loaded into the FIFO output register.

In operation, the A/D converter 10 is essentially inactive in its operation until selected by the computer processor. The computer processor activates the converter by executing a particular input/output instruction which is received and recognized by the converter address logic. The computer processor is then required to load the pertinent data and information into the vector, mode and command registers within conversion control logic 21, to initiate the specific analog-to-digital voltage conversion cycle. The conversion cycle sequentially converts four analog voltage values into equivalent binary values and sequentially stores the binary values in the FIFO registers 20. At the completion of a conversion cycle the conversion control logic circuit 21 signals the computer processor that the converted information is available, and the computer processor then initiates a further input/output instruction for reading the information into the computer processor via the databus. In all respects, the A/D converter 10 is accessible by the computer processor as though it were merely another form of input/output equipment. During each conversion cycle the computer processor will receive four binary values, representative of one of the eight single-ended analog voltages and all three of the double-ended analog voltages presented to the A/D converter 10. The computer processor may select any of the eight single-ended analog voltages for transfer at any time, by merely sending the appropriate signals at the time it is initiating the operation of A/D converter 10.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

What is claimed is:

1. An analog-to-digital voltage conversion circuit which is programmably selectable by a computer processor through a computer processor data bus, control bus and address bus comprising:

(a) address selection logic connectable to said address bus, including means for generating a circuit activation signal in response to predetermined signals on said address bus;

(b) a conversion control logic circuit connectable to said control bus and said data bus, said conversion control logic circuit having means for decoding signals on said data bus and said control bus and generating input control signals in response thereto, and means for generating output control signals to said data bus and said control bus;

(c) an output register connectable to said data bus, said output register having a plurality of input signal lines;

(d) a plurality of analog voltage lines respectively connectable to a plurality of analog voltage sources;

(e) a first group of analog voltage sample-and-hold circuits respectively connected to each of a first group of said plurality of analog voltage lines, including means for simultaneously holding the analog voltage values on said first group of analog voltage lines;

(f) a first analog voltage multiplexer circuit having means for selectively diverting one of a plurality of analog voltage signal inputs to a first multiplexer output, said voltage signal inputs being connected to a second group of said plurality of analog voltage lines;

(g) a second analog voltage multiplexer circuit having means for selectively diverting one of a plurality of analog voltage signal inputs to a second multiplexer output, said voltage signal inputs being respectively connected to said first multiplexer output and each of said means for simultaneously holding the analog voltage values on said first group of analog voltage lines;

(h) an analog-to-digital converter circuit having an analog voltage-receiving input connected to said second multiplexer output, and having a plurality of binary voltage outputs each connected to one of said output register input signal lines;

(i) said conversion control logic circuit having means for controlling said first analog multiplexer means for selectively diverting, and having means for controlling said first group of analog voltage sample-and-hold circuits, means for simultaneously holding the analog voltage values, and having means for controlling said second multiplexer means for selectively diverting.

2. The apparatus of claim 1, wherein said conversion control logic circuit further comprises a command register connectable to said data bus and connected to said first analog voltage multiplexer circuit, including means for selectively activating said multiplexer circuit means for diverting, to select one of said plurality of analog voltage signal inputs.

3. The apparatus of claim 2, wherein said conversion control logic circuit further comprises means for sequencing said second analog voltage multiplexer to sequentially divert all of said voltage signal inputs to said second multiplexer output.

4. The apparatus of claim 3, wherein said output register further comprises a plurality of register ranks and means for sequentially shifting data from said input signal lines through all of said register ranks.

5. The apparatus of claim 4, wherein said address selection logic circuit activation signal is connected to said conversion control logic circuit.

6. The apparatus of claim 5, wherein said conversion control logic circuit further comprises means for generating an interrupt signal to said computer processor.

7. The apparatus of claim 6, wherein said conversion control logic circuit and said command register further comprises means for selectably adjusting the gain of said first analog voltage multiplexer analog voltage signal inputs.

8. The apparatus of claim 7, wherein said first analog voltage multiplexer analog voltage signal inputs further comprise single-ended inputs, and said first group of said plurality of analog voltage lines each further comprise two-line inputs.

9. Apparatus for simultaneously sampling a plurality of analog voltages and sequentially converting same into binary signal representations and transferring the binary signal representations to a computer processor databus on commands received on a control bus from the computer processor, comprising:

(a) a plurality of voltage sampling circuits, each connected to one of the plurality of analog voltages;

(b) a plurality of voltage holding circuits, each connected to one of the plurality of voltage sampling circuits, and each having an actuating input and means for holding the voltage of the voltage sampling circuit upon activation of said actuating input;

(c) a multiplexer circuit having a plurality of inputs, each of said inputs connected to one of said plurality of voltage holding circuits, said multiplexer circuit further having an output signal line and a control input line and means for sequentially gating each of said plurality of inputs to said output signal line in response to a signal received at said control input line;

(d) an analog-to-digital conversion circuit having an analog voltage input connected to said multiplexer output signal line and a plurality of binary signal output lines, said circuit having means for converting the analog voltage at its input into binary signal representations at its plurality of binary signal output lines;

(e) a plurality of registers interconnected to sequentially gate a plurality of binary signals from one register to the next register, the first of said registers connected to said analog-to-digital conversion circuit's plurality of binary signal output lines and the last of said registers connected to said computer processor data bus, said plurality of registers having control means for controlling the sequential gating; and (f) means for controlling, connected to said computer processor control bus, including means for decoding signals received over said control bus, means for simultaneously activating said voltage holding circuits, actuating inputs, means for signaling said multiplexer circuit control input line, means for activating the control means in said plurality of registers and means for gating the last of said registers to said computer processor data bus.

* * * * *